(12) United States Patent
Davis et al.

(10) Patent No.: US 6,692,994 B2
(45) Date of Patent: Feb. 17, 2004

(54) METHOD FOR MANUFACTURING A PROGRAMMABLE CHALCOGENIDE FUSE WITHIN A SEMICONDUCTOR DEVICE

(75) Inventors: John D. Davis, Manassas, VA (US); Thomas J. McIntyre, Nokesville, VA (US); John C. Rodgers, Fairfax, VA (US); Keith K. Sturcken, Nokesville, VA (US); Peter W. Spreen, Fairfax, VA (US); Tushar K. Shah, Columbia, MD (US)

(73) Assignee: BAE Systems, Information and Electronic Systems Integration, Inc., Nashua, NH (US)

( * ) Notice: Subject to any disclaimer, the term of this patent is extended or adjusted under 35 U.S.C. 154(b) by 14 days.

(21) Appl. No.: 10/180,645

(22) Filed: Jun. 26, 2002

(65) Prior Publication Data
US 2003/0045034 A1 Mar. 6, 2003

Related U.S. Application Data

(62) Division of application No. 09/943,178, filed on Aug. 30, 2001, now Pat. No. 6,448,576.

(51) Int. Cl.[7] .................. H01L 21/82; H01L 21/8238; H01L 29/04
(52) U.S. Cl. .............. 438/128; 438/204; 438/132; 438/622; 257/50
(58) Field of Search .................. 438/128, 132, 438/204, 622; 257/50

(56) References Cited

U.S. PATENT DOCUMENTS

| | | | |
|---|---|---|---|
| 4,599,705 A | | 7/1986 | Holmberg et al. |
| 4,814,853 A | * | 3/1989 | Uchida ...................... 257/530 |
| 4,868,616 A | | 9/1989 | Johnson et al. |
| 5,210,598 A | | 5/1993 | Nakazaki et al. |
| 5,341,328 A | | 8/1994 | Ovshinsky et al. |
| 5,359,205 A | | 10/1994 | Ovshinsky |
| 5,821,160 A | * | 10/1998 | Rodriguez et al. ........ 438/601 |
| 5,851,882 A | | 12/1998 | Harshfield |
| 6,118,135 A | | 9/2000 | Gonzalez et al. |
| 6,284,643 B1 | * | 9/2001 | Reinberg .................... 438/622 |
| 6,333,546 B1 | * | 12/2001 | Marmillion et al. ........ 257/529 |
| 6,495,395 B2 | * | 12/2002 | Reinberg .................... 438/107 |
| 6,507,061 B1 | * | 1/2003 | Hudgen et al. ............. 257/295 |
| 6,548,358 B2 | * | 4/2003 | Arndt et al. ................ 438/281 |
| 6,548,397 B2 | * | 4/2003 | Reinberg .................... 438/622 |
| 6,555,458 B1 | * | 4/2003 | Yu .............................. 438/601 |

* cited by examiner

Primary Examiner—Michael S. Lebentritt
Assistant Examiner—Michael K. Luhrs
(74) Attorney, Agent, or Firm—David J. Long; Antony P. Ng; Bracewell & Patterson, L.L.P.

(57) ABSTRACT

A method for manufacturing a programmable chalcogenide fuse within a semiconductor device is disclosed. A resistor is initially formed on a substrate. Then, a chalcogenide fuse is formed on top of the resistor. Finally, a conductive layer is deposited on top of the chalcogenide fuse for providing electrical conduction to the chalcogenide fuse.

8 Claims, 4 Drawing Sheets

METHOD FOR MANUFACTURING A PROGRAMMABLE CHALCOGENIDE FUSE WITHIN A SEMICONDUCTOR DEVICE

This is a Division of application Ser. No. 09/943,178, filed Aug. 30, 2001 now U.S. Pat. No. 6,448,576.

BACKGROUND OF THE INVENTION

1. Technical Field

The present invention relates to a method for manufacturing semiconductor devices in general, and in particular to a method for manufacturing programmable fuses. Still more particularly, the present invention relates to a method for manufacturing a programmable chalcogenide fuse within a semiconductor device.

2. Description of the Prior Art

Redundancy circuitry is typically employed to improve the yield of integrated circuits that fail due to localized defects. For example, when a memory cell has a defect that prohibits functionality, a redundant circuit can be switched in via a physical disconnection of a wiring element, commonly known as a fuse, via laser energy. Such programming of redundant circuits is usually performed during the manufacturing process and is hidden from users.

Programmable fuses are often utilized to implement redundancy repair on memory devices or to provide lot identification. A commonly used programmable fuse structure in a memory device is comprised of electrically conductive materials such as aluminum, copper, or polysilicon. A programmable fuse within a memory device can be programmed, i.e., blown open, with a laser beam. Typically, the programming of a fuse within a memory device is performed by guiding a laser beam over a fuse matrix within the memory device to convert a failing address file into a functional address file. The laser beam has sufficient energy to evaporate the conductive fuse and permanently program (or "blow") the programmable fuse into an electrically and physically open condition. One drawback of such method is the requirement of additional tools, such as lasers with steppers, and programming algorithms, which adds delays to manufacturing. Another drawback is that some programmable fuses, such as titanium tungsten fuses, have been known to grow back under certain conditions, which creates a huge reliability problem. However, the major drawback associated with the above-mentioned programmable fuse is that those fuses cannot be reprogrammed. In other words, once a fuse has been evaporated, the fuse cannot be reused again.

Consequently, it is desirable to provide a method for manufacturing an improved programmable fuse within a semiconductor device. The improved programmable fuse is re-programmable and is reasonably easy to implement.

SUMMARY OF THE INVENTION

In accordance with a preferred embodiment of the present invention, a resistor is initially formed on a substrate. Then, a chalcogenide fuse is formed on top of the resistor. Finally, a conductive layer is deposited on top of the chalcogenide fuse for providing electrical conduction to the chalcogenide fuse.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is illustrated with a complementary-metal-oxide semiconductor (CMOS) processing method, though other types of processing technology may also be applicable.

Figure 1A:
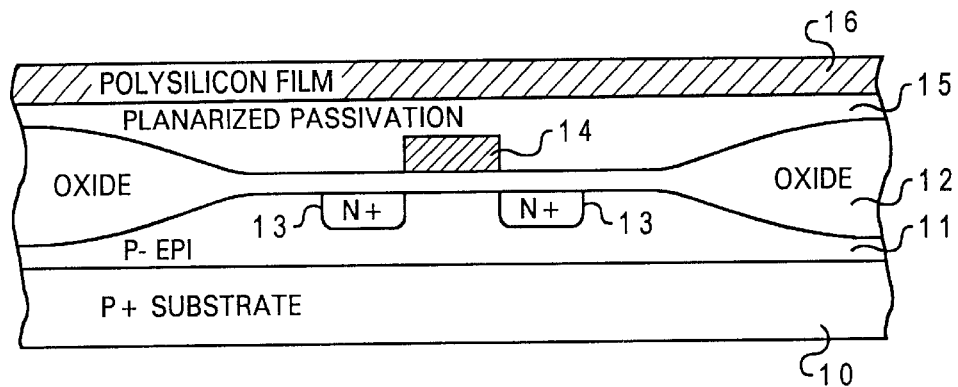
FIGS. 1a–1h are pictorial representations of a process for manufacturing a programmable chalcogenide fuse within a semiconductor device, in accordance with a preferred embodiment of the present invention.

Referring now to the drawings and in particular to FIGS. 1a–1h, there are illustrated pictorial representations of a process for fabricating a programmable chalcogenide fuse within an integrated circuit, in accordance with a preferred embodiment of the present invention. The process begins with a silicon wafer having an optional epitaxial layer on which active devices can be built. As shown in FIG. 1a, a silicon substrate 10 includes an optional epitaxial layer 11. A silicon dioxide ($SiO_2$) layer 12 having multiple local oxidations of silicon (LOCOS) isolations or shallow trench isolations (STI) may be utilized to isolate one active device from another. In this example, the active device is a transistor formed by n-type diffusions 13 and a polysilicon gate 14. The transistor is covered by a planarized passivation layer 15. A polysilicon film 16 is then deposited on top of passivation layer 15. Polysilicon film 16 is preferably given a low dose implant, such as an arsenic implant at $4.6E^{14}/cm^2$ at 100 KeV, to make polysilicon film 16 relatively resistive.

Figure 1B:
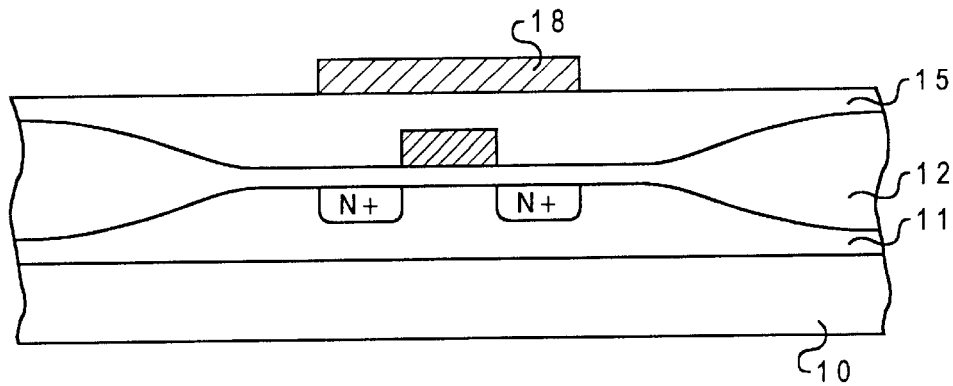

Next, a layer of photoresist is spun on and patterned to define etching areas for polysilicon film 16, as it is well-known to those skilled in the art. Polysilicon layer 16 is then etched via a reactive ion etching (RIE) process. The unetched portions of polysilicon layer 16 become polysilicon resistors, such as a polysilicon resistor 18 as depicted in FIG. 1b.

Figure 1C:
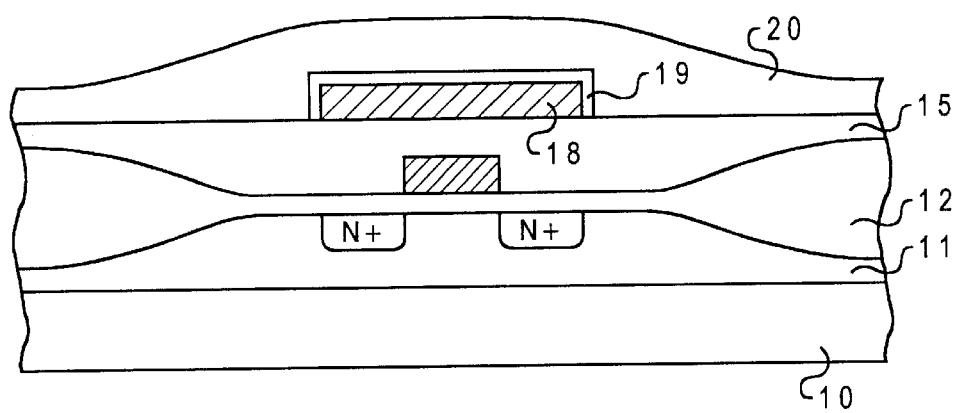

Subsequently, substrate 10 is exposed to an oxidizing ambient, such as a chamber filled with oxygen gas, in order to grow an oxide layer 19 on top of polysilicon resistor 18. Specifically, substrate 10 is placed in an oxide tube and polysilicon resistor 18 is heated to allow a shell of $SiO_2$ (i.e., oxide layer 19) to be grown on top of polysilicon resistor 18. Afterwards, a chalcogenide layer 20 of preferably 0.5 um thick is deposited over passivation layer 15, covering oxide layer 19 and polysilicon resistor 18, as shown in FIG. 1c. Chalcogenide is a phase-change alloy that is well-known in the art. Oxide layer 19 acts as a dielectric isolation between polysilicon resistor 18 and chalcogenide layer 20.

Figure 1D:
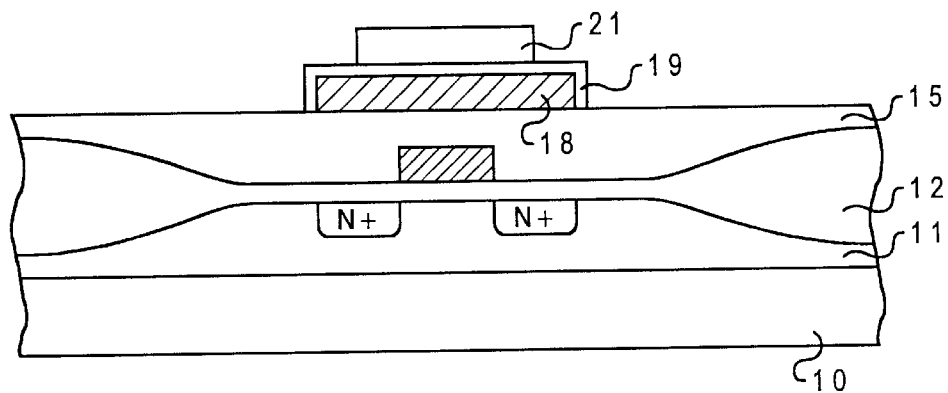

A layer of photoresist is spun on and patterned to define etching areas for chalcogenide layer 20, as it is well-known to those skilled in the art. Chalcogenide layer 20 is then etched via a RIE process. The unetched portions of chalcogenide layer 20 become chalcogenide fuses, such as a chalcogenide fuse 21 as depicted in FIG. 1d. A top view of chalcogenide fuse 21, oxide layer 19, and polysilicon resistor 18 (in dashed lines) is illustrated FIG. 1e. Afterwards, a passivation layer 24 is deposited, patterned, and etched to provide contact openings, such as contacts 23a, 23b, to chalcogenide fuse 21.

Next, a thin film of titanium (Ti) followed by a thin film of titanium nitride (TiN) are deposited to form a Ti/TiN adhesion layer 22 within contacts 23a, 23b. Ti/TiN adhesion layer 22 is preferably 0.08 um thick. A tungsten layer 30 is then deposited to fill the openings at contacts 23a, 23b. Tungsten layer 30 is subsequently isolated using a chemical-mechanical polishing (CMP) process to form tungsten plugs at contacts 23a, 23b. Next, a thick film of aluminum layer 25, preferably 0.5 um, is deposited on top of passivation layer 24, and tungsten plugs. Aluminum layer 25 is then etched, as it is well-known to those skilled in the art, to provide ohmic contact to contacts 23a, 23b.

Figure 1E:
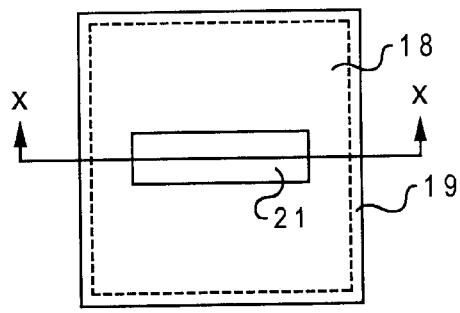
Figure 1F:
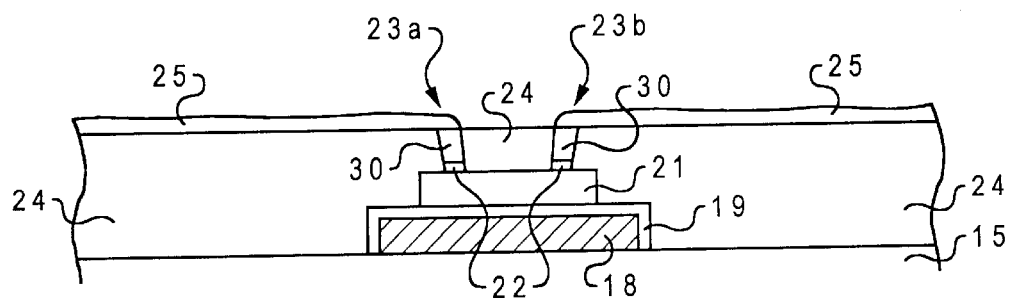

FIG. 1f is a cross-section view of polysilicon resistor 18, chalcogenide fuse 21, Ti/TiN adhesion layer 22, passivation layer 24, tungsten layer 30, and aluminum layer 25 along line x—x of FIG. 1e.

Figure 1G:
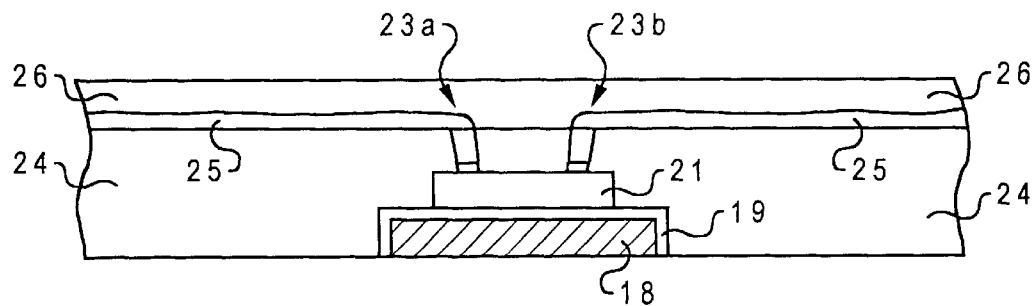
Figure 1H:
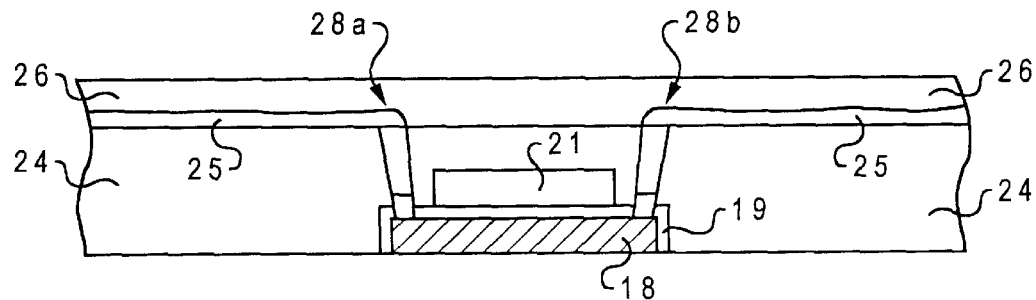

Next, the silicon wafer is annealed. A passivation layer 26 is then deposited on top of aluminum layer 25, as depicted in FIG. 1g. The programmable fuse structure is now complete with polysilicon resistor 18 that can heat programmable chalcogenide fuse 21 to activate a phase change. Chalcogenide fuse 21 may be indirectly heated by sending a current through polysilicon resistor 18. Similar to FIG. 1g, FIG. 1h illustrates contacts 28a and 28b being defined in polysilicon resistor 18 such that current may be sent through polysilicon resistor 18 to heat chalcogenide fuse 21.

Figure 2:
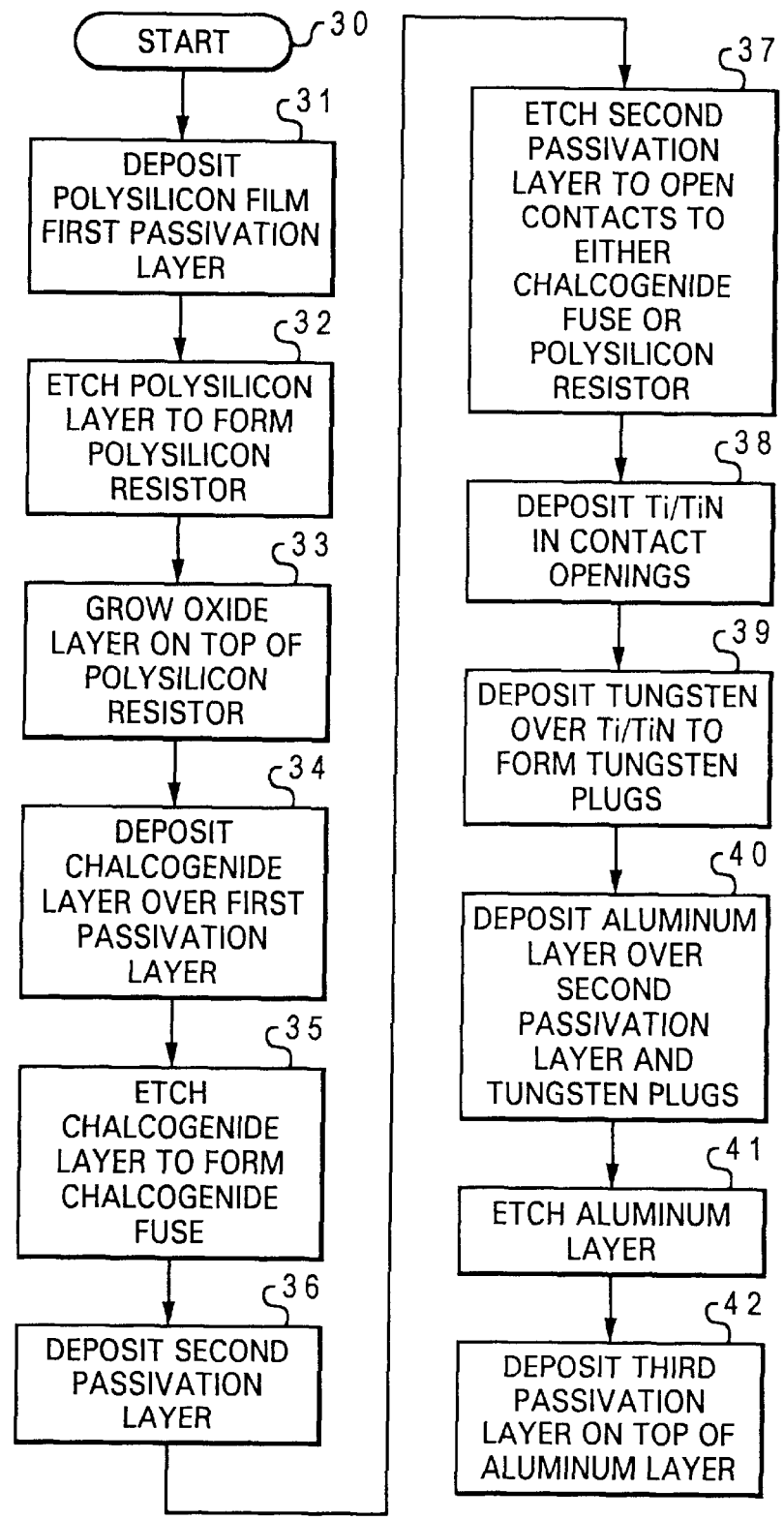
FIG. 2 is a high-level process flow diagram of a method for manufacturing the programmable chalcogenide fuse from FIGS. 1a–1h, in accordance with a preferred embodiment of the present invention.

With reference now to FIG. 2, there is illustrated a high-level process flow diagram of a method for manufacturing the programmable chalcogenide fuse from FIGS. 1a–1h, in accordance with a preferred embodiment of the present invention. Starting at block 30, a polysilicon film is deposited on top of a first passivation layer covering various active devices, as shown in block 31. The polysilicon layer is then etched to form a polysilicon resistor, as depicted in block 32. An oxide layer is grown on top of the polysilicon resistor, as illustrated in block 33. Afterwards, a chalcogenide layer is deposited over the first passivation layer, covering the oxide layer and the polysilicon resistor, as shown in block 34. The chalcogenide layer is then etched to form a programmable chalcogenide fuse, as depicted in block 35. A second passivation layer is deposited, as illustrated in block 36. Next, the second passivation layer is etched to form contacts to either chalcogenide fuse and/or polysilicon resistor, as shown in block 37. Afterwards, a thin film of Ti followed by a thin film of TiN are deposited in the contacts openings to form a Ti/TiN adhesion layer within the contact openings, as depicted in block 38. Then, a tungsten layer is deposited over the Ti/TiN adhesion layer to form a tungsten plug within each contact openings, as illustrated in block 39. Next, an aluminum layer is deposited over the second passivation layer and the tungsten plugs, as shown in block 40. Specific locations of the aluminum layer are then etched, as depicted in block 41. Finally, a third passivation layer is deposited on top of the aluminum layer, as illustrated in block 42.

As has been described, the present invention provides a method of manufacturing a programmable chalcogenide fuse within a semiconductor device. In an amorphous state, a chalcogenide fuse, such as chalcogenide fuse 21 has a high electrical resistance, but in a polycrystalline state, the chalcogenide fuse has a low electrical resistance. Thus, chalcogenide fuse 21 can be electrically addressed to change from very conductive to very resistive. In other words, chalcogenide fuse 21 can be utilized as an on/off switch for programming or reprogramming circuits within a semiconductor device in-situ. When conductive, chalcogenide fuse 21 acts as a wiring element and can turn a connected circuit on. When resistive, chalcogenide fuse 21 acts as an open circuit and can turn a connected circuit off. Chalcogenide fuse 21 may also be utilized in the form of a wiring line or a plug that can be inserted in a contact or via as a stud material.

Figure 3:
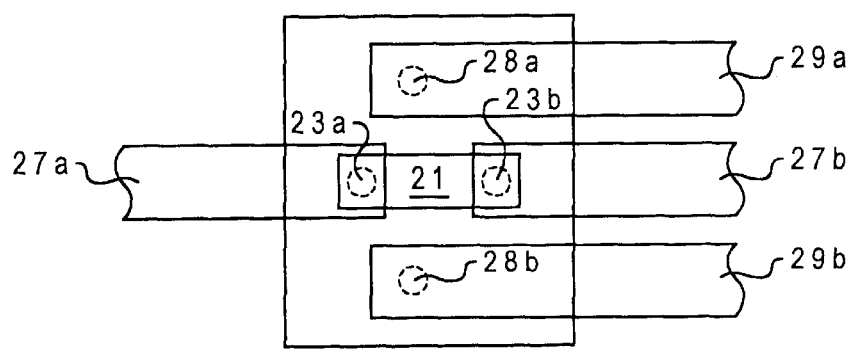
FIG. 3 is a top view of a programmable chalcogenide fuse, in accordance with a preferred embodiment of the present invention.

The phase of chalcogenide fuse 21 can be programmed directly with current or indirectly with heat. Referring now to FIG. 3, there is illustrated a top view of chalcogenide fuse 21 along with different contacts, in accordance with a preferred embodiment of the present invention. As shown in FIG. 3, current for programming chalcogenide fuse 21 can be directly applied from a conductive layer 27a to a conductive layer 27b. The programming current flows from conductive layer 27a to conductive layer 27b via contacts 23a and 23b (see also FIG. 1g) to change the phase of chalcogenide fuse 21. In order to program chalcogenide fuse 21 indirectly, current for programming chalcogenide fuse 21 can be applied from a conductive layer 29a to a conductive layer 29b. The programming current flows from conductive layer 29a to conductive layer 29b via contacts 28a and 28b to heat polysilicon resistor 18 (see also FIG. 1h) such that the phase of chalcogenide fuse 21 can be changed from the heat generated by polysilicon resistor 18. Conductive layers 27a–27b and 29a–29b may be a metal layer or a polysilicon layer.

Typically, failing addresses are detected and recorded when a device is tested by the manufacturer. Each failing address can be recorded or mapped into a programmable fuse matrix on the device. In use, comparative circuitry exists to detect a live address to the addresses mapped in the programmed fuse matrix. When the comparator detects a match, an alternative or redundant circuit is invoked. The data is either written or read in the redundant circuit. By using chalcogenide as the material to make a fuse structure, the fuse can be programmed with normal power levels while the device is being tested. Chalcogenide fuses can also be reprogrammed if a fault develops after manufacturing. On-chip logic could be added so that the detection and replacement of defective rows or columns could be implemented on-chip transparent to a data processing system.

Furthermore, chalcogenide fuses can be incorporated into a chalcogenide based memory array as well as into a bipolar, metal-oxide semiconductor, ferroelectric or other technology memory array or logic devices. Thus, the application of chalcogenide fuses ranges from a simple non-volatile redundancy circuit to a complex, dynamically programmable, defect self-detecting and repairing device.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a re-programmable fuse in a semiconductor device, said method comprising:
    forming a resistor above a substrate;
    forming an oxidation layer over said resistor;
    forming a chalcogenide fuse above said resistor;
    forming a passivation layer over said substrate, said oxidation layer and said chalcogenide fuse;
    etching said passivation layer to form contact vias;
    depositing material into said contact vias to form plugs; and
    depositing a conductive layer above said chalcogenide fuse.

2. The method of claim 1, wherein said resistor is a polysilicon resistor.

3. The method of claim 2, wherein said polysilicon resistor is formed by an arsenic implant at $4.6E^{14}/cm^2$ at 100 KeV.

4. The method of claim 1, wherein said conductive layer is an aluminum layer.

5. The method of claim 1, wherein said conductive layer further includes a titanium and titanium nitride.

6. The method of claim 1, wherein said method further includes forming an oxide layer over said resistor.

7. The method of claim 1, wherein said plugs form electrical connections to connect to said chalcogenide fuse.

8. The method of claim 1, wherein said plugs form electrical connections to connect to said resistor.

* * * * *